United States Patent
Mobin et al.

(10) Patent No.: US 9,325,546 B1
(45) Date of Patent: Apr. 26, 2016

(54) DATA RATE AND PVT ADAPTATION WITH PROGRAMMABLE BIAS CONTROL IN A SERDES RECEIVER

(71) Applicant: LSI Corporation, San Jose, CA (US)

(72) Inventors: Mohammad S. Mobin, Orefield, PA (US); Weiwei Mao, Macungie, PA (US); Brett D. Hardy, Chaska, MN (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 14/541,345

(22) Filed: Nov. 14, 2014

(51) Int. Cl.
*H04L 27/01* (2006.01)
*H04L 7/00* (2006.01)

(52) U.S. Cl.
CPC .............. *H04L 27/01* (2013.01); *H04L 7/0079* (2013.01)

(58) Field of Classification Search
CPC .................. H04L 25/03019; H04L 25/03057; H04L 2025/0349; H04L 2025/03617; H04B 7/0845
USPC ......................................... 375/232–234, 350
See application file for complete search history.

(56) References Cited

U.S. PATENT DOCUMENTS

| | | | | |
|---|---|---|---|---|
| 5,293,405 | A * | 3/1994 | Gersbach et al. | 375/232 |
| 5,812,594 | A * | 9/1998 | Rakib | 375/219 |
| 5,903,857 | A * | 5/1999 | Behrens et al. | 702/190 |
| 7,440,525 | B2 * | 10/2008 | Moughabghab et al. | 375/345 |
| 7,835,464 | B2 * | 11/2010 | Preisach | 375/316 |
| 8,054,876 | B2 * | 11/2011 | Tsai | 375/233 |
| 8,135,100 | B2 * | 3/2012 | Beukema et al. | 375/350 |
| 8,175,823 | B2 * | 5/2012 | Mezer et al. | 702/57 |
| 8,478,128 | B2 * | 7/2013 | Aronson et al. | 398/135 |
| 8,509,299 | B2 * | 8/2013 | Finn et al. | 375/233 |
| 8,891,607 | B2 * | 11/2014 | Zhong | 375/233 |
| 8,964,907 | B2 * | 2/2015 | Telang et al. | 375/340 |
| 9,048,999 | B2 * | 6/2015 | He et al. | |
| 9,071,478 | B2 * | 6/2015 | Luo et al. | |
| 9,077,328 | B1 * | 7/2015 | Valliappan et al. | |
| 9,172,566 | B1 * | 10/2015 | Li | H04L 25/03885 |
| 2004/0091028 | A1 * | 5/2004 | Aronson et al. | 375/219 |
| 2006/0188043 | A1 * | 8/2006 | Zerbe et al. | 375/346 |
| 2013/0188656 | A1 * | 7/2013 | Ferraiolo et al. | 370/503 |
| 2013/0322506 | A1 * | 12/2013 | Zerbe et al. | 375/224 |
| 2014/0225669 | A1 * | 8/2014 | Zhong et al. | 330/254 |
| 2014/0269881 | A1 * | 9/2014 | He et al. | 375/231 |
| 2014/0281763 | A1 * | 9/2014 | Ran et al. | 714/704 |
| 2015/0085914 | A1 * | 3/2015 | Kizer et al. | 375/233 |
| 2015/0195108 | A1 * | 7/2015 | Prokop et al. | |

* cited by examiner

Primary Examiner — Emmanuel Bayard

(57) ABSTRACT

Described embodiments provide for, in a SerDes device, an adaptation process that adjusts data path gain through programmable-bias based on process, voltage, temperature (PVT) and data rate changes. Such adaptation process extends bias current dynamic range, and low frequency gain can be programmed to a desired target range of values for a given variable gain amplifier (VGA) setting at any PVT and data rate corner. A receive (RX) data path structure auto-adapts data path gain through programmable bias based on sensed PVT and data rate changes. The low frequency attenuation/gain range is extended, and can be programmed to a desirable targeted range by a SerDes device RX adaptive process for a given VGA and linear equalizer (LEQ) setting at any given PVT and data rate condition.

20 Claims, 4 Drawing Sheets

DATA RATE AND PVT ADAPTATION WITH PROGRAMMABLE BIAS CONTROL IN A SERDES RECEIVER

BACKGROUND

In many data communication applications, Serializer and De-serializer (SerDes) devices facilitate the transmission between two points of parallel data across a serial link. Data at one point is converted from parallel data to serial data and transmitted through a communications channel to the second point where it received and converted from serial data to parallel data.

At high data rates, frequency-dependent signal loss from the communications channel (e.g., the signal path between the two end points of a serial link) as well as signal dispersion and distortion can occur. As such, the communications channel, whether wired, optical, or wireless, acts as a filter and might be modeled in the frequency domain with a transfer function. Correction for frequency dependent losses of the communications channel, and other forms of signal degradation, often requires signal equalization at a receiver of the signal. Equalization through use of one or more equalizers compensates for the signal degradation to improve communication quality.

An eye pattern, also known as an eye diagram ("data "eye" or "eye"), represents a digital data signal from a receiver that is repetitively sampled and applied to the vertical input (axis), while the horizontal input (axis) represents time as a function of the data rate. The eye diagram allows for evaluation of the combined effects of channel noise and inter-symbol interference on the performance of a baseband pulse-transmission system, and the input data eye is the synchronized superposition of all possible realizations of the signal of interest viewed within a particular signaling interval (referred to generally as the data eye), which for convenience might be referred to generally as a unit interval or "UI". A data slicer (i.e., a Data Latch) in a SerDes device is used for digitizing an analog signal in the serial data receiver, and is usually set in magnitude and phase to the center of the data eye. Precision of the latch threshold has substantial impact on performance (e.g., error rate, jitter tolerance) of the SerDes device.

Current SerDes devices have a fixed termination impedance that may not necessarily be the best termination, even if it is trimmed to 50 ohm (the standard desired termination value) since the characteristic impedance of the channel may not necessarily be 50 ohm. In the current SerDes devices, the termination values in the transmit (TX) and receive (RX) paths are static and are prone to process, voltage and temperature (PVT) variation. A RX termination not matching the channel creates discontinuity at integrated circuit (IC) chip boundaries. Even an ideal 50 ohm termination is not necessarily the optimal termination. A mistuned termination with respect to the channel creates poor return loss and hence degraded receiver operating margin.

In a SerDes RX data path, which includes a variable gain amplifier (VGA), linear equalizer (LEQ), multiplexer (MUX) and combiner (e.g., a H1 SUMMER), the reference bias for each stage is fixed for each stage of RX data path, i.e. bias for each of the VGA, LEQ, MUX and H1 Summer is fixed. The low frequency gain of the RX data path typically has a large variation over PVT. In some systems, about 20 dB gain variation over PVT can be observed for a RX data path. This large variation of low frequency gain adversely affects the performance of a SerDes device.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

In one embodiment, bias of a receive data path in a receiver device is set by initializing, by bias adjustment circuitry, bias settings of at least one of a variable gain amplifier (VGA), a linear equalizer (LEQ), a multiplexer (MUX) and a combiner of the receive data path to initial bias settings. A data rate of incoming data of the receive data path is detected; and, with corresponding sensors, at least one of a present process, temperature and voltage level for the receive data path is measured. Bias adaptation control logic associates the detected data rate and the at least one measured present process, temperature and voltage level for the receive data path with corresponding bias settings for boost and for gain or attenuation in the receive data path; and adjusts the bias of the at least one of the variable gain amplifier (VGA), the linear equalizer (LEQ), the multiplexer (MUX) and the combiner of the receive data path based on the associated corresponding bias settings for boost and for gain or attenuation.

BRIEF DESCRIPTION OF THE DRAWINGS

Other aspects, features, and advantages will become more fully apparent from the following detailed description, the appended claims, and the accompanying drawings in which like reference numerals identify similar or identical elements.

DETAILED DESCRIPTION

In accordance with the described embodiments, an adaptation process adjusts data path gain through programmable-bias based on process, voltage, temperature (PVT) and data rate changes. Such adaptation process extends bias current dynamic range, and low frequency gain can be programmed to a desired target range of values for a given variable gain amplifier (VGA) setting at any PVT and data rate corner. A receive (RX) data path structure auto-adapts data path gain through programmable bias based on sensed PVT and data rate changes. The low frequency attenuation/gain range is extended, and can be programmed to a desirable targeted range by a SerDes device RX adaptive process for a given VGA and linear equalizer (LEQ) setting at any given PVT and data rate condition. The programmable-bias might be accomplished based on knowledge of a given application (or other integrated circuit (IC) implementation) and data rate. For example, in a 12G full rate SerDes application, a more stressed channel and data path is expected and programmable for higher gain. In a half- or quarter-rate application, the channel is less stressed and requires more attenuation, so RX bias self-programs for more attenuation.

Figure 1:
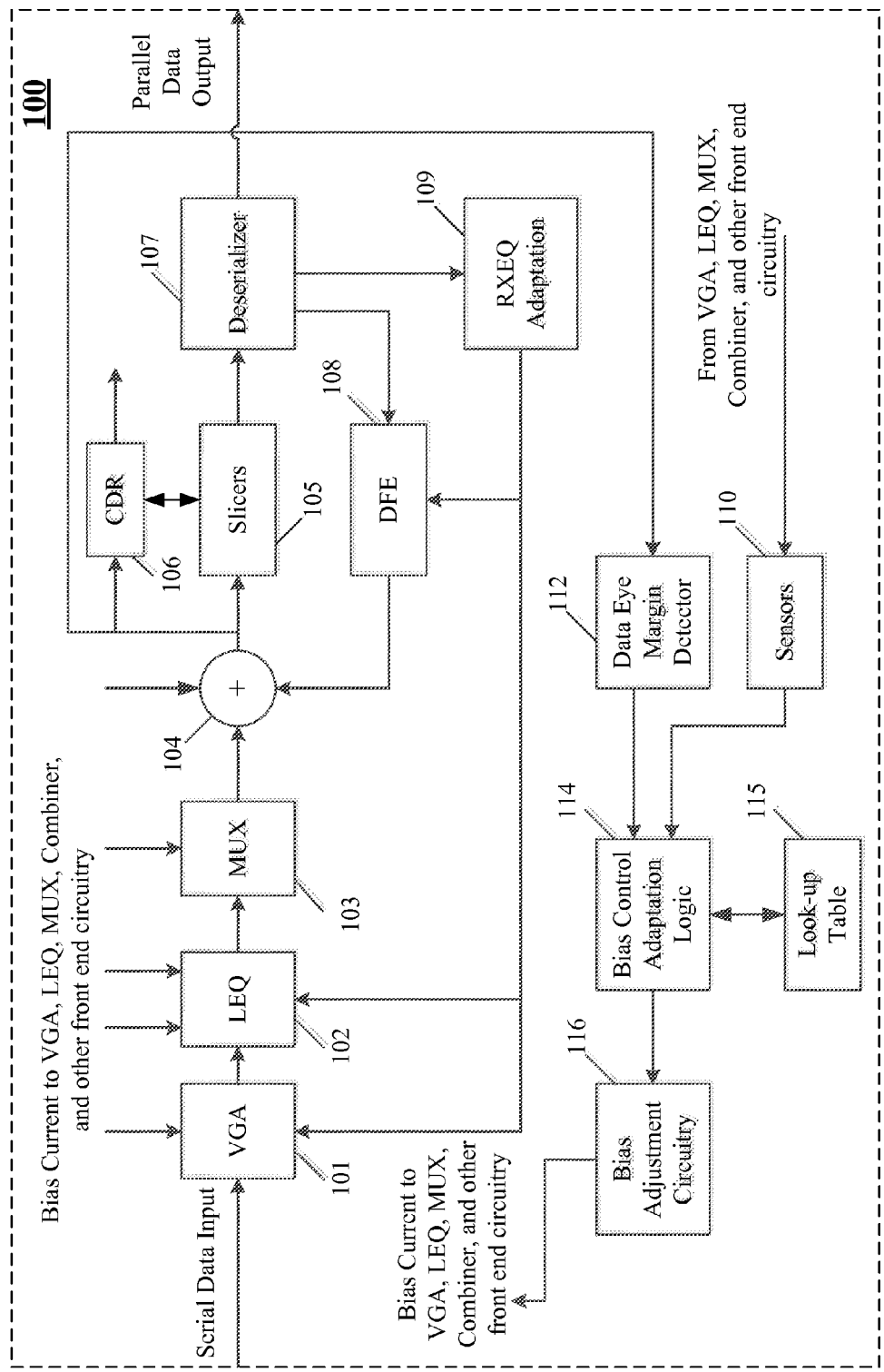
FIG. 1 shows a block diagram of a Serializer-Deserializer (SerDes) receiver employing one or more exemplary embodiments.

FIG. 1 shows an exemplary serializer-deserializer (SerDes) receiver 100 employing an exemplary embodiment. Ser- Des receiver 100 includes input amplifier (e.g., variable gain amplifier or VGA) 101, linear equalizer (e.g., analog linear equalizer or LEQ) 102, multiplexer (MUX) 103 and combiner 104 (which represents several adders, or e.g., an H1 SUMMER). SerDes receiver 100 further includes input slicers (e.g., latches) 105. Slicers 105 comprise one or more decision devices providing decisions for input data, and generates a reconstructed serial data stream. Clock and data recovery (CDR) 106 is coupled to slicers 105, and also receives the input to slicers 105. CDR 106 recovers an input data clock signal, and generates clock signals having a known phase alignment. CDR 106 comprises a phase detector (e.g., a BBPD) and associated logic controller to detect a center of a data eye and adjust transition and data sampling clocks. Output clock signals from CDR 106 might be employed to time sampling of latches placed within a data eye output from combiner 104. SerDes receiver 100 further includes deserializer 107, decision feedback equalizer (DFE) 108, and receiver equalizer coefficient adaptation circuitry (RXEQ adaptation) 109.

The serial input data from a channel, degraded after transmission through the channel, passes through VGA 101 that provides amplification for gain enhancement, and then is further enhanced in LEQ 102 to compensate for added loss through potential low pass filtering characteristics of the channel. From LEQ 102, the data is sent to MUX 103 and a summing node of combiner 104. MUX 103 and a summing node of combiner 104 operate to select received data and apply filtering coefficients, e.g., first order H1 filter coefficients, to the data. Optionally, combiner 104 receives feedback coefficients for additional enhancement using output from DFE 108. Slicers 105 provides decisions for input data, and generates the reconstructed serial data stream. Deserializer 107 deserializes the data for output, as well as for input decisions for DFE 108, which decision feedback equalization techniques are well known to those skilled in the art. All of the enhancement parameters are adapted through filter and coefficient adaptation processes of RXEQ adaptation 109 in order to achieve maximum horizontal and vertical eye opening seen at (input to) slicers 105, which leads to a low error rate. Hence the accuracy of the latches of slicers 105 (data, transition and error for LMS adaptation algorithm) is important for achieving low SerDes error rates.

Slicers 105 represent one or more decision devices for a input data. As known in the art, the term "slicer" and "latch" are often used interchangeably for a decision device, which compares an input value to a threshold to generate an output decision based on a clock signal, and this clock signal (from a CDR) might be a sampling signal. Sampling is employed to detect transitions within the data eye as well as horizontal and vertical bounds, errors, and margins. The threshold of the latch determines a vertical height within the eye, while the phase determines the horizontal position of the threshold detection time within the eye.

SerDes receiver 100 incorporates an adaptation process, and includes sensors 110, bias control adaptation logic 114, look-up table 115, and current bias adjustment circuitry 116. Data path gain adaptation in accordance with described embodiments employs sensors 110 to detect data rate, process corners, voltage and temperature levels from VGA 101, LEQ 102, MUX 103 and other front end circuitry as necessary. Data eye margin detector 112 is provided monitor horizontal and vertical margins of the data eye to ensure bias control adaptation is properly setting values for optimization of the data eye. Bias control adaptation logic 114, which applies an optimization algorithm to adaptively adjust values of gain, attenuation and boost of VGA 101, LEQ 102, and MUX 103 (and other front end circuitry as necessary) though control by current bias adjustment circuitry 116. Such values selected for bias adjustment circuitry 116 by bias control adaptation logic 114 might be stored in memory as a look-up table 115.

In FIG. 1, sensors 110 might comprises an auto-data rate detector, on chip ring oscillator based process sensor, adaptive voltage, scaling & optimization (AVSO) voltage detector, and an on-chip temperature sensor. The on chip ring oscillator based process sensor, AVSO voltage detector, and on-chip temperature sensor are used to monitor the PVT and data rate changes in the receiver operation. The PVT and data rate information are sent to bias control adaptation logic 114, which accesses look-up table 115 to get values to control the bias for the data path low frequency gain and LEQ boost.

Figure 2:
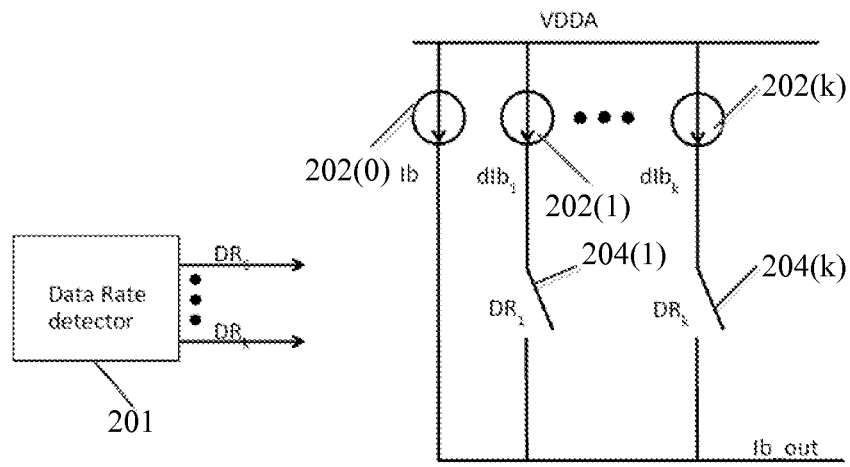
FIG. 2 shows a single data rate control controlled bias configuration in accordance with an exemplary embodiment.

FIG. 2 shows a single data rate control controlled bias configuration. Data rate detector 201 detects the incoming data rate to the receiver. Based on one of the detected data rates, DR1 to DRk, data rate detector 201 controls one or more of switches 204(1) through 204(k) to adjust the reference bias from corresponding current generators 202(1) through 202(k) for the data path gain and LEQ boost corresponding to detected data rate. Note that current generator 202(0) provides current corresponding to baseline or initial current bias.

Figure 3:
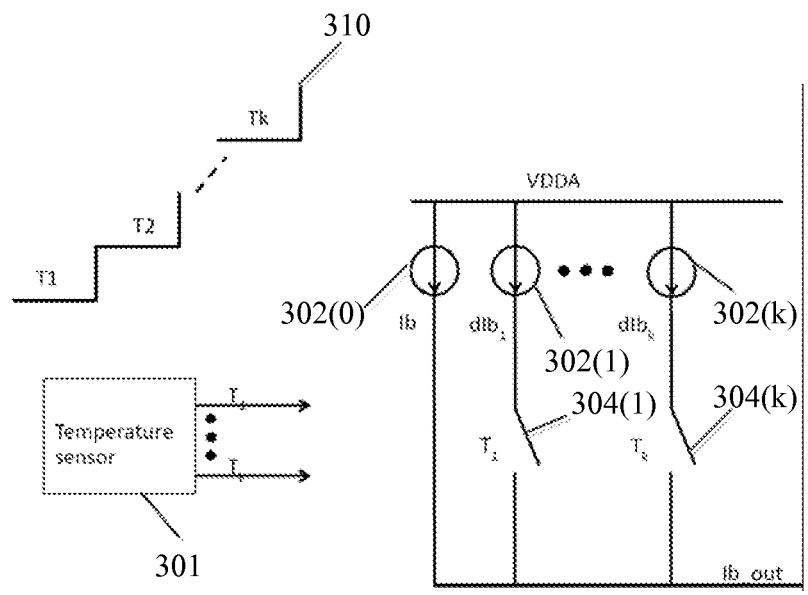
FIG. 3 shows a single temperature controlled bias configuration in accordance with an exemplary embodiment.

FIG. 3 shows a single temperature controlled bias configuration. Temperature sensor 301 determines one of a number of temperature regions, T1, T2, . . . , Tk, in which the chip (e.g., integrated circuit) is presently operating. Based on the temperature region, temperature sensor 301 controls one or more of switches 304(1) through 304(k) to adjust the reference bias from corresponding current generators 302(1) through 302(k) for the data path gain and LEQ boost corresponding to detected temperature region. Note that current generator 302(0) provides current corresponding to baseline or initial current bias.

Figure 4:
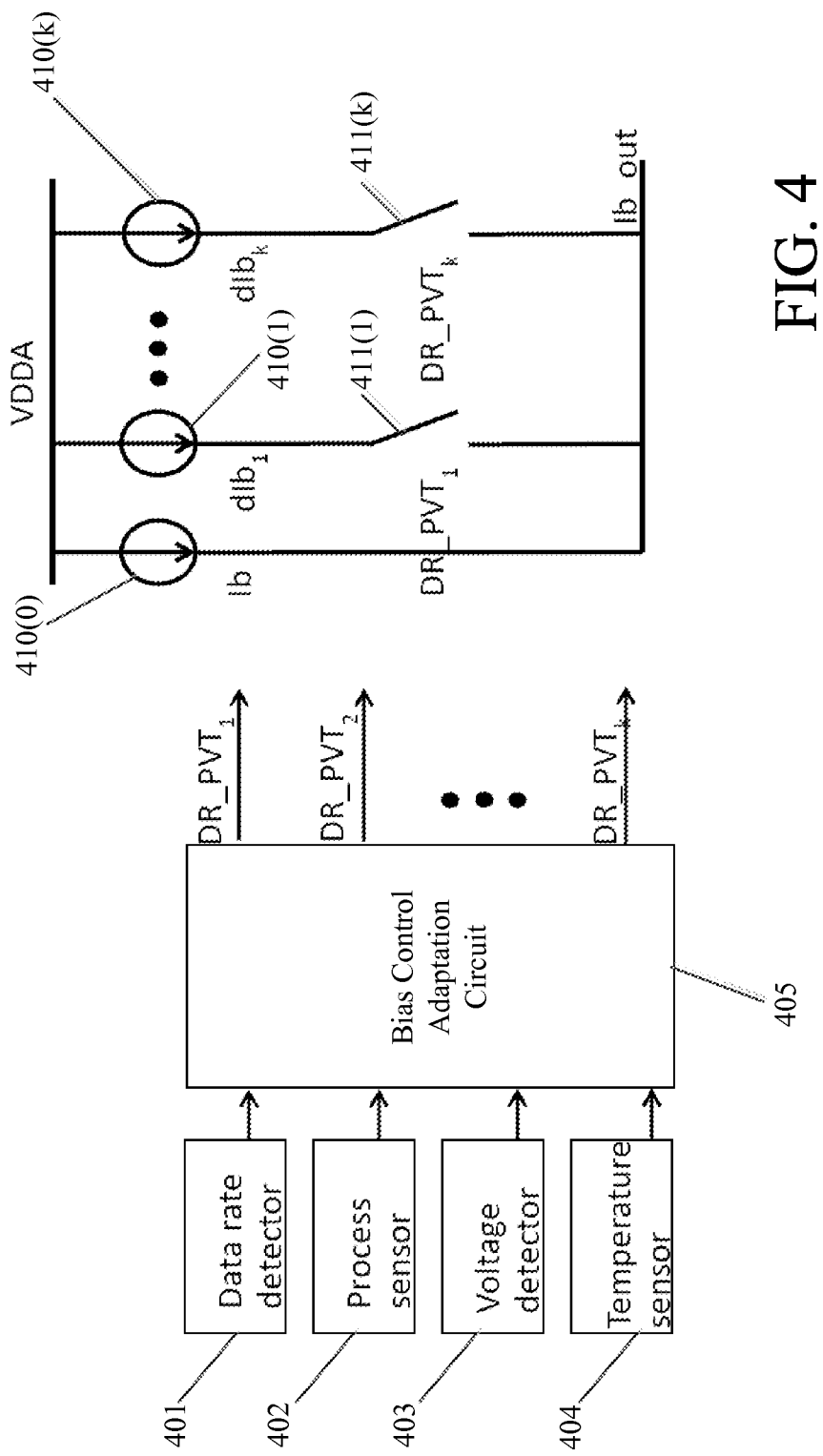
FIG. 4 shows a complete data rate and PVT controlled bias configuration in accordance with an exemplary embodiment.

FIG. 4 shows a complete data rate and PVT controlled bias configuration. Bias programming can be done based on the knowledge of application and data rate. Data rate detector 401 detects the incoming data rate to the receiver; process sensor 402 determines one of a number of process corners for the present operating region; voltage detector 403 detects the operating voltage of the receiver; and temperature sensor 404 determines one of a number of temperature regions of operation. Bias control adaptation circuit 405 controls one or more of switches 411(1) through 411(k) to adjust the reference bias from corresponding current generators 410(1) through 410(k) for the data path gain and LEQ boost corresponding to detected PVT and data rate. Note that current generator 410(0) provides current corresponding to baseline or initial current bias. Switches 411(1) through 411(k) to adjust the reference bias from corresponding current generators 410(1) through 410(k) might be included in bias adjustment circuitry 116 shown in FIG. 1.

In FIG. 4, bias control adaptation circuit 405 might include programmable logic, processor or a state machine (e.g., bias control adaptation logic 114 of FIG. 1) and a look up table (e.g., look-up table 115 of FIG. 1). The look up table is used which stores predetermined values $DR\_PVT_1$ through $DR\_PVT_k$ as bias control settings to set the bias for each pre-calculated data rate and PVT condition. The look-up table can be generated through circuit simulations. In the RX path operation, data rate, process, voltage and temperature conditions are detected and sent to the programmable bias control adaptation circuit, which controls corresponding switches to adjust the reference bias for the data path gain and LEQ boost.

The exemplary embodiments of FIGS. 2, 3, and 4 are shown as implemented with PMOS circuits. As apparent to one skilled in the art might, other implementations, such as with NMOS circuitry, might also be employed. Such techniques described herein might be tailored to the particular IC process and characteristics.

An RX data path circuit with programmable reference bias might be simulated over various PVT corners and these simulations employed to determine values for predetermined values $DR\_PVT_1$ through $DR\_PVT_k$ as bias control settings. The data path attenuation range over RX bias current sweep for different regulator output voltage settings can be simulated for low, medium and high VGA values. For low VGA settings, a large attenuation is desirable. With decreasing RX bias current, the attenuation range is increased for all three major PVT corners. If VGA reaches a ceiling (maximum value), a large gain is desirable. With increasing RX bias current, the gain range is increased. In a fixed bias RX data path, wide gain spread and wide attenuation spread over PVT occurs. In both cases due to lack of gain and attenuation range over PVT spread the RX performance is compromised. However, employing described embodiments with programmable bias, the gain and attenuation of the RX data path can be controlled over a very narrow PVT spread.

Figure 5:
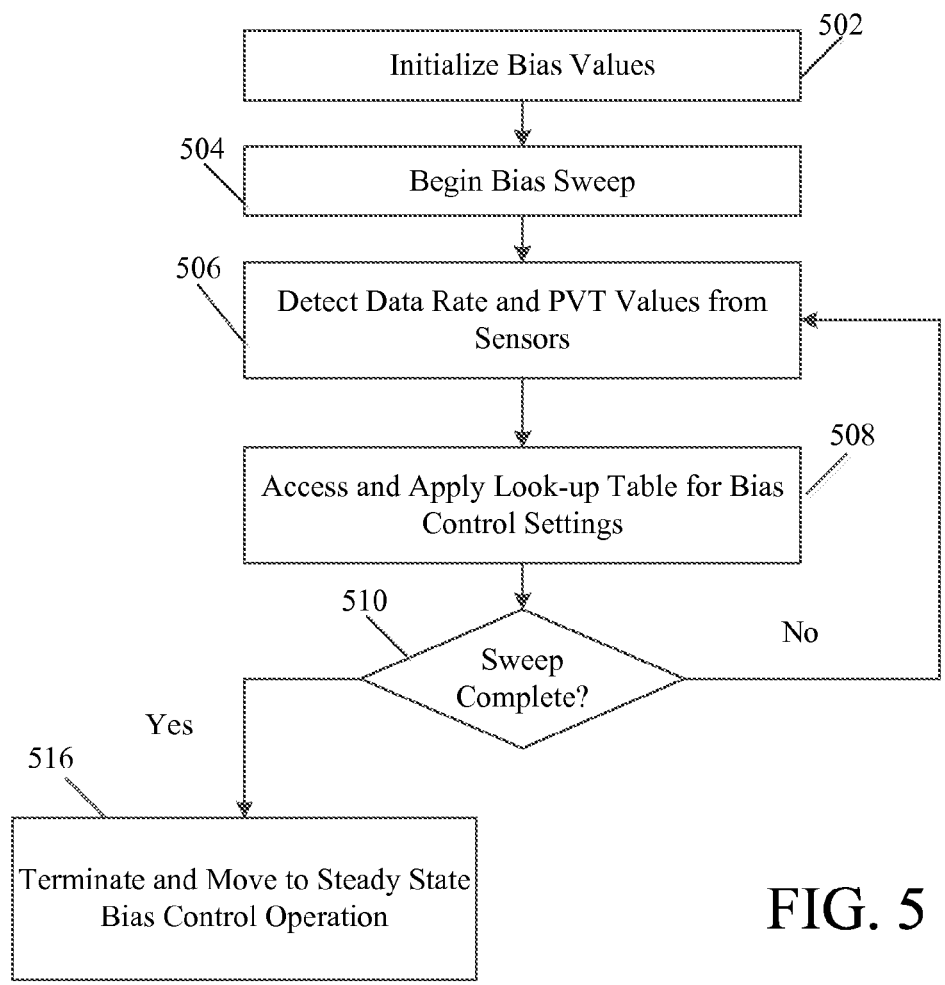
FIG. 5 illustrates a process as might be employed by a state machine or processor implementing an exemplary bias control adaptation algorithm.

FIG. 5 illustrates a process as might be employed by a state machine or processor (e.g., processor circuitry and associated software) implementing an exemplary bias control adaptation algorithm.

At step 502, as the SerDes system is brought up, initial bias value settings are used for present bias settings of the RX data path. At step 504, a bias sweep begins. The bias sweep is an interative/recursive process that adjusts the bias settings over a range and selects optimum bias control values in accordance with a bias control adaptation algorithm. At step 506, the present data rate and PVT values are read from the sensors. At step 508, the process accesses the look-up table for bias control settings and applies the settings to bias adjustment circuitry.

At step 510, a test determines whether the sweep is complete. The test of step 510 might be performed by a processor or logic circuitry such as shown in FIG. 1 (e.g., bias control adaptation logic 114, which applies an optimization algorithm to adaptively adjust bias control setting values). Such test might re-examine sensor output values and compare such values against thresholds, might correspond to expiration of a timer to indicate that a required period of operating time has occurred, or might be based on measurements of data eye margin.

If the test of step 510 determines the sweep is not complete (NO), then the process returns to step 506. If the test of step 510 determines the sweep is complete (YES), then, at step 516, the process terminates and moves to steady state bias control operation. Although the process might end with step 518, other embodiments might continually monitor impedance, and repeat the process shown in FIG. 5 over time, especially as termination impedance changes with changing process, voltage and temperature.

Reference herein to "one embodiment" or "an embodiment" means that a particular feature, structure, or characteristic described in connection with the embodiment can be included in at least one embodiment. The appearances of the phrase "in one embodiment" in various places in the specification are not necessarily all referring to the same embodiment, nor are separate or alternative embodiments necessarily mutually exclusive of other embodiments. The same applies to the term "implementation."

As used in this application, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion.

Additionally, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Moreover, the terms "system," "component," "module," "interface,", "model" or the like are generally intended to refer to a computer-related entity, either hardware, a combination of hardware and software, software, or software in execution. For example, a component may be, but is not limited to being, a process running on a processor, a processor, an object, an executable, a thread of execution, a program, and/or a computer. By way of illustration, both an application running on a controller and the controller can be a component. One or more components may reside within a process and/or thread of execution and a component may be localized on one computer and/or distributed between two or more computers.

While the exemplary embodiments of the present invention have been described with respect to processes of circuits, including possible implementation as a single integrated circuit, a multi-chip module, a single card, or a multi-card circuit pack, the present invention is not so limited. As would be apparent to one skilled in the art, various functions of circuit elements may also be implemented as processing blocks in a software program. Such software may be employed in, for example, a digital signal processor, micro-controller, or general purpose computer.

The present invention can be embodied in the form of methods and apparatuses for practicing those methods. The present invention can also be embodied in the form of program code embodied in tangible media, such as magnetic recording media, optical recording media, solid state memory, floppy diskettes, CD-ROMs, hard drives, or any other machine-readable storage medium, wherein, when the program code is loaded into and executed by a machine, such as a computer, the machine becomes an apparatus for practicing the invention. The present invention can also be embodied in the form of program code, for example, whether stored in a storage medium, loaded into and/or executed by a machine, or transmitted over some transmission medium or carrier, such as over electrical wiring or cabling, through fiber optics, or via electromagnetic radiation, wherein, when the program code is loaded into and executed by a machine, such as a computer, the machine becomes an apparatus for practicing the invention. When implemented on a general-purpose processor, the program code segments combine with the processor to provide a unique device that operates analogously to specific logic circuits. The present invention can also be embodied in the form of a bitstream or other sequence of signal values electrically or optically transmitted through a medium, stored magnetic-field variations in a magnetic recording medium, etc., generated using a method and/or an apparatus of the present invention.

Unless explicitly stated otherwise, each numerical value and range should be interpreted as being approximate as if the word "about" or "approximately" preceded the value of the value or range.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments of the present invention.

As used herein in reference to an element and a standard, the term "compatible" means that the element communicates with other elements in a manner wholly or partially specified by the standard, and would be recognized by other elements as sufficiently capable of communicating with the other elements in the manner specified by the standard. The compatible element does not need to operate internally in a manner specified by the standard.

Through the whole document, the term "connected to" or "coupled to" that is used to designate a connection or coupling of one element to another element includes both a case that an element is "directly connected or coupled to" another element and a case that an element is "electronically connected or coupled to" another element via still another element.

Further, the term "comprises or includes" and/or "comprising or including" used in the document means that one or more other components, steps, operation and/or existence or addition of elements are not excluded in addition to the described components, steps, operation and/or elements.

Signals and corresponding nodes or ports may be referred to by the same name and are interchangeable for purposes here.

No claim element herein is to be construed under the provisions of 35 U.S.C. §112, sixth paragraph, unless the element is expressly recited using the phrase "means for" or "step for."

It is understood that various changes in the details, materials, and arrangements of the parts which have been described and illustrated in order to explain the nature of this invention may be made by those skilled in the art without departing from the scope of the embodiments of the invention as encompassed in the following claims.

We claim:

1. A method of setting bias of a receive data path in a receiver device, the method comprising:
   initializing, by bias adjustment circuitry, bias settings of at least one of a variable gain amplifier (VGA), a linear equalizer (LEQ), a multiplexer (MUX) and a combiner of the receive data path to initial bias settings;
   detecting a data rate of incoming data of the receive data path;
   measuring, with corresponding sensors, at least one of a present process, temperature and voltage level for the receive data path; and
   associating, by bias adaptation control logic, a combination of the detected data rate and the at least one measured present process, temperature and voltage level for the receive data path with corresponding bias settings for boost and for gain or attenuation in the receive data path; and
   adjusting the bias of the at least one of the variable gain amplifier (VGA), the linear equalizer (LEQ), the multiplexer (MUX) and the combiner of the receive data path based on the associated corresponding bias settings for boost and for gain or attenuation that were associated with the combination of the detected data rate and the at least one of measured present process, temperature, and voltage level for the receive data path.

2. The method of claim 1, wherein, the associating including accessing a look-up table in memory having a table of bias settings for boost and for gain or attenuation in the receive data path, wherein entries of the table are addressed via corresponding data rate, process, voltage and temperature levels.

3. The method of claim 1, comprising repeating the measuring, associating and adjusting until the receive data path reaches a steady state condition.

4. The method of claim 3, wherein the repeating includes receiving at least one present data eye margin value, and comparing the present data eye margin value to a threshold to determine the steady state condition.

5. The method of claim 4, wherein the present data eye margin value includes at least one of a horizontal and a vertical margin.

6. The method of claim 1, wherein the adjusting, by bias control circuitry, the bias of the at least one of the variable gain amplifier (VGA), the linear equalizer (LEQ), the multiplexer (MUX) and the combiner includes enabling or disabling switches of corresponding bias current generators based on the associated corresponding bias settings for boost and for gain or attenuation.

7. The method of claim 1, comprising monitoring the receiver device over changing Process, Voltage and Temperature (PVT) conditions, wherein the method is applied repeatedly over to maintain a relatively steady condition in the receive data path.

8. The method of claim 1, wherein the method is embodied in a Serializer/Deserializer (SerDes) device.

9. Apparatus for setting bias of a receive data path in a receiver device, the apparatus comprising:
   bias adjustment circuitry configured to initialize bias settings of at least one of a variable gain amplifier (VGA), a linear equalizer (LEQ), a multiplexer (MUX) and a combiner of the receive data path to initial bias settings;
   a data rate detector configured to detect a data rate of incoming data of the receive data path;
   sensors configured to measure at least one of a present process, temperature and voltage level for the receive data path; and
   bias control adaptation logic configured to associate a combination of the detected data rate and the at least one measured present process, temperature and voltage level for the receive data path with corresponding bias settings for boost and for gain or attenuation in the receive data path; and
   wherein the bias control adaptation logic adjusts, via a control signal to the bias adjustment circuitry, the bias of the at least one of the variable gain amplifier (VGA), the linear equalizer (LEQ), the multiplexer (MUX) and the combiner of the receive data path based on the associated corresponding bias settings for boost and for gain or attenuation that were associated with the combination of the detected data rate and the at least one of measured present process, temperature, and voltage level for the receive data path.

10. The apparatus of claim 9, wherein, the bias control adaptation logic accesses a look-up table in memory having a table of bias settings for boost and for gain or attenuation in the receive data path, wherein entries of the table are addressed via corresponding data rate, process, voltage and temperature levels.

11. The apparatus of claim 9, wherein the apparatus repetitively measures, associates and adjusts until the receive data path reaches a steady state condition.

12. The apparatus of claim 11, wherein the bias control adaptation logic receives at least one present data eye margin value, and compares the present data eye margin value to a threshold to determine the steady state condition.

13. The apparatus of claim 11, wherein the bias control circuitry adjusts the bias of the at least one of the variable gain amplifier (VGA), the linear equalizer (LEQ), the multiplexer (MUX) and the combiner by enabling or disabling switches of corresponding bias current generators based on the associated corresponding bias settings for boost and for gain or attenuation.

14. The apparatus of claim 9, wherein the sensors monitor the receiver device over changing Process, Voltage and Temperature (PVT) conditions to maintain a relatively steady condition in the receive data path.

15. The apparatus of claim 9, wherein the apparatus is embodied in a Serializer/Deserializer (SerDes) device.

16. The apparatus of claim 9, wherein the apparatus is embodied in an integrated circuit.

17. A non-transitory machine-readable storage medium, having encoded thereon program code, wherein, when the program code is executed by a machine, the machine implements a method for setting bias of a receive data path in a receiver device, comprising:

initializing, by bias adjustment circuitry, bias settings of at least one of a variable gain amplifier (VGA), a linear equalizer (LEQ), a multiplexer (MUX) and a combiner of the receive data path to initial bias settings;

detecting a data rate of incoming data of the receive data path;

measuring, with corresponding sensors, at least one of a present process, temperature and voltage level for the receive data path; and associating, by bias adaptation control logic, a combination of the detected data rate and the at least one measured present process, temperature and voltage level for the receive data path with corresponding bias settings for boost and for gain or attenuation in the receive data path; and adjusting the bias of the at least one of the variable gain amplifier (VGA), the linear equalizer (LEQ), the multiplexer (MUX) and the combiner of the receive data path based on the associated corresponding bias settings for boost and for gain or attenuation.

18. The non-transitory machine-readable storage medium of claim 17, wherein, the associating including accessing a look-up table in memory having a table of bias settings for boost and for gain or attenuation in the receive data path, wherein entries of the table are addressed via corresponding data rate, process, voltage and temperature levels.

19. The non-transitory machine-readable storage medium of claim 17, comprising repeating the measuring, associating and adjusting until the receive data path reaches a steady state condition.

20. The non-transitory machine-readable storage medium of claim 19, wherein the repeating includes receiving at least one present data eye margin value, and comparing the present data eye margin value to a threshold to determine the steady state condition.

* * * * *